US009507468B2

(12) United States Patent
Jiang et al.

(10) Patent No.: US 9,507,468 B2
(45) Date of Patent: Nov. 29, 2016

(54) ELECTROMECHANICAL POLYMER-BASED SENSOR

(71) Applicant: Strategic Polymer Sciences, Inc., State College, PA (US)

(72) Inventors: Li Jiang, Union City, CA (US); Lawrence Wang, Mountain View, CA (US); Matthew Douglas Rogge, Petaluma, CA (US); Brian Zellers, Bellefonte, PA (US); Christophe Ramstein, San Francisco, CA (US)

(73) Assignee: Novasentis, Inc., State College, PA (US)

( * ) Notice: Subject to any disclaimer, the term of this patent is extended or adjusted under 35 U.S.C. 154(b) by 98 days.

(21) Appl. No.: 14/015,875

(22) Filed: Aug. 30, 2013

(65) Prior Publication Data
US 2015/0061703 A1    Mar. 5, 2015

(51) Int. Cl.
| | |
|---|---|
| *G01R 27/26* | (2006.01) |
| *G06F 3/044* | (2006.01) |
| *G06F 3/042* | (2006.01) |
| *G06F 3/01* | (2006.01) |

(52) U.S. Cl.
CPC ............ *G06F 3/044* (2013.01); *G06F 3/016* (2013.01); *G06F 3/0428* (2013.01); *G01R 27/2605* (2013.01)

(58) Field of Classification Search
CPC ............ H01L 2924/00; H01L 41/042; H01L 41/083; H01L 41/1132; G06F 3/016; G06F 3/0428; G06F 3/044; G01R 27/2605
USPC .......... 324/76.11–76.83, 459, 600, 649, 658, 324/686
See application file for complete search history.

(56) References Cited

U.S. PATENT DOCUMENTS

| | | |
|---|---|---|
| 5,263,876 A | 11/1993 | Johnescu et al. |
| 5,350,966 A | 9/1994 | Culp |

(Continued)

FOREIGN PATENT DOCUMENTS

| | | |
|---|---|---|
| JP | 2010283926 A | 12/2010 |
| JP | 2011172339 A | 9/2011 |

(Continued)

OTHER PUBLICATIONS

International Search Report and Written Opioion for PCT/US2014/053499, date of mailing Dec. 18, 2014, 8 pgs.

(Continued)

*Primary Examiner* — Son Le
*Assistant Examiner* — Raul Rios Russo
(74) *Attorney, Agent, or Firm* — Edward C. Kwok; Hogan Lovells US LLP

(57) ABSTRACT

An electromechanical polymer (EMP) sensor includes (a) a first set of EMP layers provided between a first electrode and a second electrode forming a capacitor, the first set of EMP layers having one or more EMP layers capable of being activated by application of a voltage across the first and second electrodes; and (b) a sensing circuit coupled to the first electrode and the second electrode for detecting a change in capacitance or a change in voltage across the first and second electrodes. The EMP sensor may further include means for disconnecting the second electrode from a ground reference after the pre-determined voltage is applied, such that the sensing circuit senses a change in capacitance. The sensing circuit may be capable of detecting a noise portion of a voltage across the first and second electrode.

19 Claims, 4 Drawing Sheets

(56) References Cited

U.S. PATENT DOCUMENTS

| | | | |
|---|---|---|---|
| 5,519,278 A | 5/1996 | Kahn et al. | |
| 6,376,971 B1 | 4/2002 | Pelrine et al. | |
| 6,423,412 B1 | 7/2002 | Zhang et al. | |
| 6,605,246 B2 | 8/2003 | Zhang et al. | |
| 6,703,257 B2 | 3/2004 | Takeuchi et al. | |
| 6,787,238 B2 | 9/2004 | Zhang et al. | |
| 6,809,462 B2 | 10/2004 | Pelrine et al. | |
| 6,833,687 B2* | 12/2004 | Landolt | H02N 1/00 320/166 |
| 6,877,325 B1 | 4/2005 | Lawless | |
| 6,888,291 B2 | 5/2005 | Arbogast et al. | |
| 7,038,357 B2 | 5/2006 | Goldenberg et al. | |
| 7,339,572 B2 | 3/2008 | Schena | |
| 7,368,862 B2 | 5/2008 | Pelrine et al. | |
| 7,567,681 B2 | 7/2009 | Pelrine et al. | |
| 7,824,406 B2 | 11/2010 | Wang et al. | |
| 7,952,261 B2 | 5/2011 | Lipton et al. | |
| 7,971,850 B2 | 7/2011 | Heim et al. | |
| 8,222,799 B2 | 7/2012 | Polyakov et al. | |
| 8,362,882 B2 | 1/2013 | Heubel et al. | |
| 8,384,271 B2 | 2/2013 | Kwon et al. | |
| 8,390,594 B2 | 3/2013 | Modarres et al. | |
| 8,517,958 B2 | 8/2013 | Eppstein et al. | |
| 8,564,181 B2 | 10/2013 | Choi et al. | |
| 2002/0091440 A1 | 7/2002 | Calcote | |
| 2007/0200467 A1* | 8/2007 | Heydt | H04R 19/02 310/311 |
| 2008/0043315 A1* | 2/2008 | Cummings | 359/290 |
| 2008/0106845 A1* | 5/2008 | Kunimatsu et al. | 361/303 |
| 2009/0002205 A1 | 1/2009 | Klinghult et al. | |
| 2009/0321775 A1* | 12/2009 | Hasnain | 257/99 |
| 2010/0079264 A1 | 4/2010 | Hoellwarth | |
| 2010/0090813 A1 | 4/2010 | Je et al. | |
| 2010/0316242 A1* | 12/2010 | Cohen | H02K 41/03 381/337 |
| 2011/0038625 A1 | 2/2011 | Zellers et al. | |
| 2011/0133598 A1 | 6/2011 | Jenninger et al. | |
| 2011/0290686 A1 | 12/2011 | Huang | |
| 2012/0017703 A1 | 1/2012 | Ikebe et al. | |
| 2012/0105333 A1 | 5/2012 | Maschmeyer et al. | |
| 2012/0121944 A1 | 5/2012 | Yamamoto et al. | |
| 2012/0126663 A1 | 5/2012 | Jenninger et al. | |
| 2012/0126959 A1 | 5/2012 | Zarrabi et al. | |
| 2012/0128960 A1 | 5/2012 | Busgen et al. | |
| 2012/0178880 A1 | 7/2012 | Zhang et al. | |
| 2012/0194448 A1 | 8/2012 | Rothkopf | |
| 2012/0206248 A1 | 8/2012 | Biggs | |
| 2012/0223880 A1 | 9/2012 | Birnbaum et al. | |
| 2013/0044049 A1 | 2/2013 | Biggs et al. | |
| 2013/0207793 A1 | 8/2013 | Weaber et al. | |
| 2014/0035735 A1 | 2/2014 | Zellers et al. | |
| 2014/0062934 A1* | 3/2014 | Coulson | G06F 3/044 345/174 |
| 2014/0085065 A1 | 3/2014 | Biggs et al. | |
| 2014/0090424 A1* | 4/2014 | Charbonneau | C03B 3/00 65/134.9 |
| 2014/0139328 A1 | 5/2014 | Zellers et al. | |
| 2014/0139329 A1 | 5/2014 | Ramstein et al. | |
| 2014/0139436 A1 | 5/2014 | Ramstein et al. | |
| 2014/0140551 A1* | 5/2014 | Ramstein | H04R 17/005 381/182 |
| 2014/0191973 A1* | 7/2014 | Zellers | G06F 3/0414 345/168 |
| 2015/0059876 A1 | 3/2015 | Ducharme et al. | |

FOREIGN PATENT DOCUMENTS

| | | |
|---|---|---|
| JP | 2012134998 A | 7/2012 |
| KR | 20060107259 A | 10/2006 |
| KR | 20110110212 A | 10/2011 |
| KR | 20120013273 A | 2/2012 |
| KR | 20120063318 A | 6/2012 |
| KR | 20120078529 A | 7/2012 |
| KR | 20120105785 A | 9/2012 |
| WO | 2010/085575 A1 | 7/2010 |

OTHER PUBLICATIONS

Matysek, Marc et al., "Combined Driving and Sensing Circuitry for Dielectric Elastomer Actuators in mobile applications", Electroactive Polymer Actuators and Devices (EAPAD) 2011, Proc. of SPIE vol. 7976, 797612, 11 pages.

Neese, Bret et al., "Large Electrocaloric Effect in Ferroelectric Polymers Near Room Temperature", Science vol. 321, Aug. 8, 2008, pp. 821-823.

Zhang Q. M. et al., "Giant Electrostriction and Relaxor Ferroelectric Behavior in Electron-Irradiated Poly(vinylidene fluoride-trifluoroethylene) Copolymer", Science vol. 280, Jun. 26, 1998, pp. 2101-2104.

Xia F. et al., "High Electromechanical Responses in a Poly(vinylidene fluoride-trifluoroethylene-chlorofluoroethylene) Terpolymer", Advanced Materials, vol. 14, Issue 21, Nov. 2002, pp. 1574-1577.

PCT International Search Report and Written Opinion date of mailing Dec. 23, 2013, International Application No. PCT/US2013/053594, 9 pages.

PCT International Search Report and Written Opinion date of mailing Mar. 17, 2014, International Application No. PCT/US2013/071085, 10 pages.

PCT International Search Report and Written Opinion date of mailing Mar. 13, 2014, International Application No. PCT/US2013/071072, 15 pages.

PCT International Search Report and Written Opinion date of mailing Mar. 20, 2014, International Application No. PCT/US2013/071075, 12 pages.

PCT International Search Report and Written Opinion date of mailing Mar. 28, 2014, International Application No. PCT/US2013/071078, 13 pages.

PCT International Search Report and Written Opinion date of mailing Apr. 28, 2014, International Application No. PCT/US2013/071062, 11 pages.

PCT International Preliminary Report on Patentability, date of mailing Jun. 4, 2015, International Application No. PCT/US2013/071072, 9 pages.

PCT International Preliminary Report on Patentability, date of mailing Jun. 4, 2015, International Application No. PCT/US2013/071075, 9 paees.

PCT International Preliminary Report on Patentability, date of mailing Jun. 4, 2015, International Application No. PCT/US2013/071078, 10 pages.

PCT International Preliminary Report on Patentability, date of mailing Jun. 4, 2015, International Application No. PCT/US2013/071085, 7 pages.

PCT International Preliminary Report on Patentability, date of mailing Jul. 16, 2015, International Application No. PCT/IB2013/003212, 15 pages.

PCT International Written Opinion date of mailing Oct. 15, 2014, International Patent Application No. PCT/IB2013/003212, 20 pages.

PCT International Search Report and Written Opinion, date of mailing Dec. 23, 2014, International Application No. PCT/US2014/053474, 10 pages.

Wois, Peter, "Micropumps—summarizing the first two decades", Microfluidics and BioMEMS, Proceedings of SPIE vol. 4560, 2001, pp. 39-52.

PCT Preliminary Report on Patentability for International Application No. PCT/US2014/053499, date of mailing Mar. 10, 2016, 7 pages.

PCT Preliminary Report on Patentability for International Application No. PCT/US2014/053474, date of mailing Mar. 10, 2016, 9 pages.

* cited by examiner

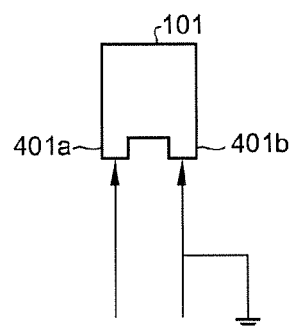 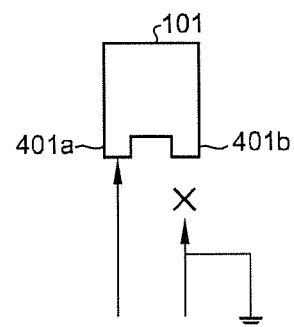
Fig. 4(a)    Fig. 4(b)
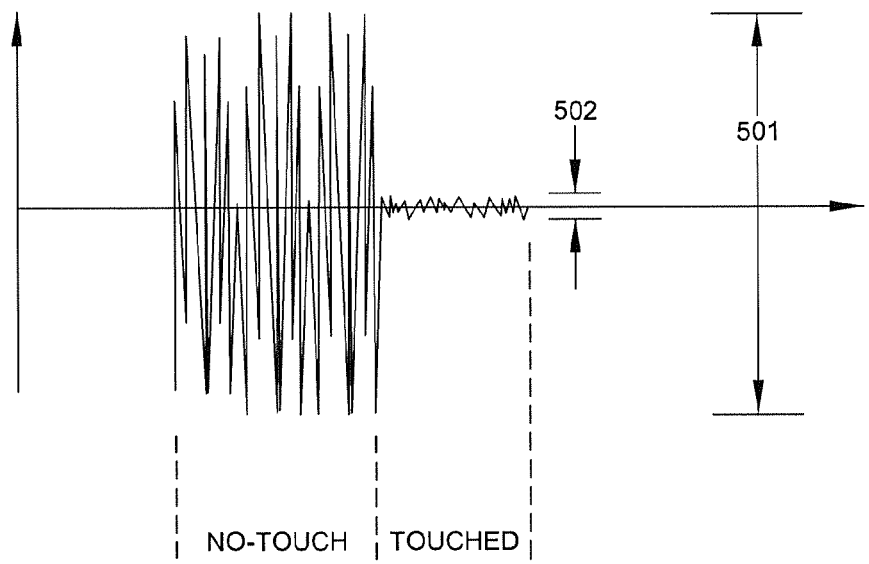
Fig. 5
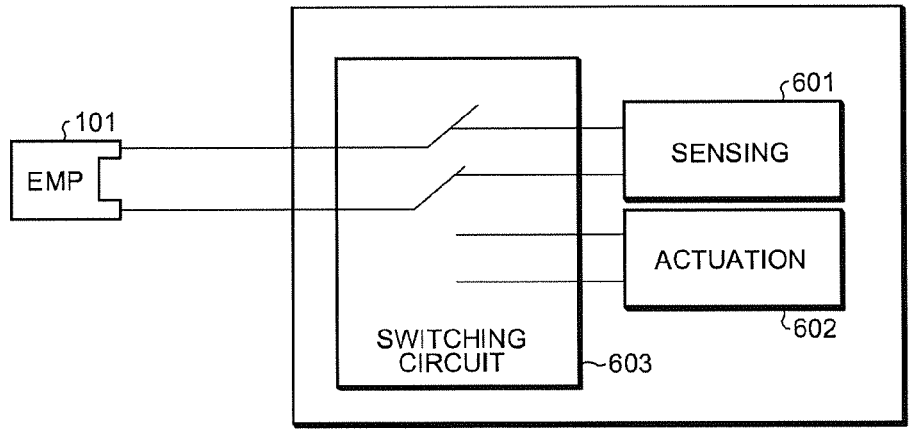
Fig. 6

ELECTROMECHANICAL POLYMER-BASED SENSOR

BACKGROUND OF THE INVENTION

1. Field of the Invention

The present invention is related to electromechanical polymer (EMP) sensors. In particular, the present invention is related to a type of EMP-based sensors that provide both EMP-based actuator and EMP-based sensors, suitable for use in a haptic response, e.g., in a handheld or mobile device.

2. Discussion of the Related Art

Electromechanical polymer (EMP) actuators are devices that contain one or more polymer layers provided between electrodes. Such an EMP actuator provides an electromechanical response to an electrical stimulus (e.g., voltage) applied across the electrodes. One example of such electromechanical responses may be, for example, a volume increase in the EMP layers that may result in a mechanical force being asserted against a substrate to which the EMP actuator is attached. Alternatively, a mechanical stimulus (e.g., a compressive force) applied to the EMP layers result in an electrical response (e.g., a voltage) appearing across the EMP layers. Such a voltage may be measured. Accordingly, an EMP actuator can also be used as a sensor.

SUMMARY

According to one embodiment of the present invention, an electromechanical polymer (EMP) sensor includes (a) a first set of EMP layers provided between a first electrode and a second electrode forming a capacitor, the first set of EMP layers having one or more EMP layers capable of being activated by application of a voltage across the first and second electrodes; and (b) a sensing circuit coupled to the first electrode and the second electrode for detecting a change in capacitance or a change in voltage across the first and second electrodes. The EMP sensor may further include means for disconnecting the second electrode from a ground reference after the pre-determined voltage is applied, such that the sensing circuit senses a change in capacitance. The sensing circuit may be capable of detecting a noise portion of a voltage across the first and second electrode.

According to one embodiment of the present invention, the EMP sensor may further include (a) an EMP actuator activation circuit; and (b) a switch circuit selectively connecting the first electrode and the second electrode to either input terminals of the sensing circuit and input terminals of the EMP actuator activation circuit. The EMP sensor may further include (a) a second set of EMP layers provided between a third electrode and a fourth electrode, the second set of EMP layers having one or more EMP layers capable of being activated by application of a voltage across the third and the fourth electrodes; and (b) an EMP actuator activation circuit coupled to the third electrode and the fourth electrode for applying an activation signal to the second set of EMP layers. The EMP sensor may have the second electrode and the fourth electrode connected to ground reference in the form of a common plate for external connection.

According to one embodiment, the first electrode and the second electrode may be formed out of transparent conducting material.

In one implementation, the EMP sensor is provided in the form of a key on a keyboard in which the key is one of an array of EMP sensors provided on a mobile device, such as on a graphical display of such a mobile device.

The present invention is better understood upon consideration of the detailed description below in conjunction with the accompanying drawings.

BRIEF DESCRIPTION OF THE DRAWINGS

FIG. 4(a) shows a conventional method of connecting a EMP sensor.

FIG. 4(b) shows EMP sensor 101 being disconnected from the ground potential, according to one embodiment of the present invention.

FIG. 5 shows the noise amplitudes 501 and 502 in the sensor output signal of precharged EMP sensor 101, corresponding respectively to whether or not EMP sensor 101 is contacted, in accordance with one embodiment of the present invention.

FIG. 6 shows EMP sensor and actuator system 600 in which EMP sensor 601 is selectively connected to sensing circuit 601 and actuation circuit 602 through switching circuit 603, in accordance with one embodiment of the present invention.

DETAILED DESCRIPTION OF THE PREFERRED EMBODIMENTS

The present invention provides electromechanical polymer-based (EMP-based) sensors and actuators. EMP-based sensors and actuators are disclosed, for example, in copending U.S. patent application ("Copending Patent Application I"), Ser. No. 13/683,990, entitled "Systems Including Electromechanical Polymer Sensors and Actuators," filed on Nov. 21, 2012. The disclosure of Copending Patent Application I is hereby incorporated by reference in its entirety.

Figure 1A:
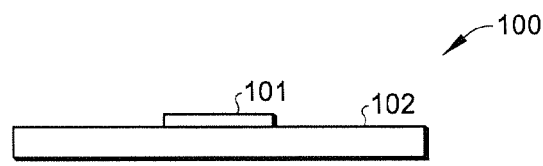
FIGS. 1(a) and 1(b) show side and top views of EMP sensor 100, respectively, according to one embodiment of the present invention.
Figure 1B:
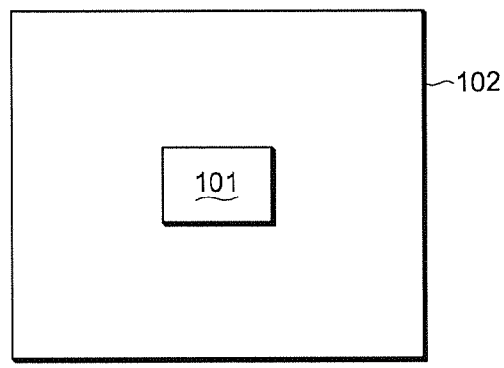
Figure 2:
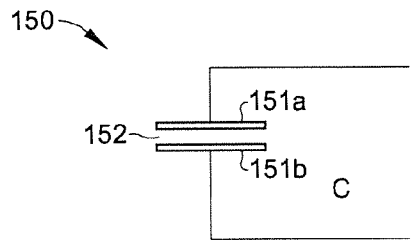
FIG. 2 is model 150 representative of EMP sensor 101, according to one embodiment of the present invention.

FIGS. 1(a) and 1(b) show side and top views of EMP sensor system 100, respectively, according to one embodiment of the present invention. As shown in FIGS. 1(a) and 1(b), EMP sensor system 100 includes EMP sensor 101 attached or bonded to substrate 102. EMP sensor 101 may include one or more EMP layers and two or more electrodes placed on the EMP layers and connected to provide an electric field across the EMP layers. FIG. 2 is model 150 representative of EMP sensor 101, according to one embodiment of the present invention. As shown in FIG. 2, model 150 includes a capacitor with capacitor electrodes 151a and 151b representing the electrodes of EMP sensor 101 and dielectric layer 152 between capacitor electrodes 151a and 151b, representing the electrical property of the EMP layers in EMP sensor 101. The electrical response on EMP sensor 101 is represented by the voltage across capacitor electrodes 151a and 151b.

Figure 1C:
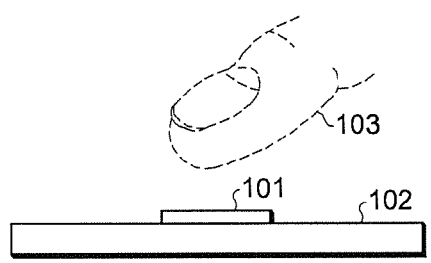
FIGS. 1(c) and 1(d) illustrate using EMP sensor system 100 as a proximity sensor, according to one embodiment of the present invention.
Figure 1D:
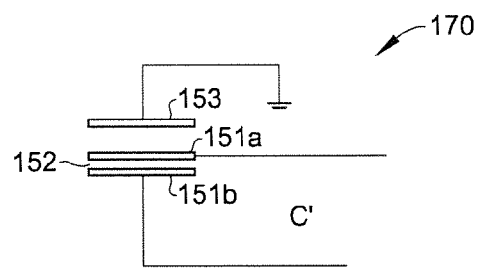

To provide a suitable dynamic range, EMP 101 may be pre-charged to a pre-determined voltage (e.g., 100 volts). FIGS. 1(c) and 1(d) illustrate using EMP sensor system 100 as a proximity sensor. FIG. 1(c) shows finger moving into the proximity of sensor EMP sensor 101. FIG. 1(d) shows model 170, which augments model 150 of FIG. 2 by including the electromagnetic effect of finger 103. The electromagnetic effect of finger 103 is modeled in FIG. 1(d) by moving ground plate 153, which changes the capacitance of the capacitor of FIG. 1(b) according to the location of finger 103 relative to EMP sensor 101. Ground plate 153 changes the effective electric field across EMP layers 101, and thus result in a change in voltage measured across capacitor electrodes 151a and 151b. Consequently, EMP sensor system 100 may serve as a proximity sensor.

Figure 3A:
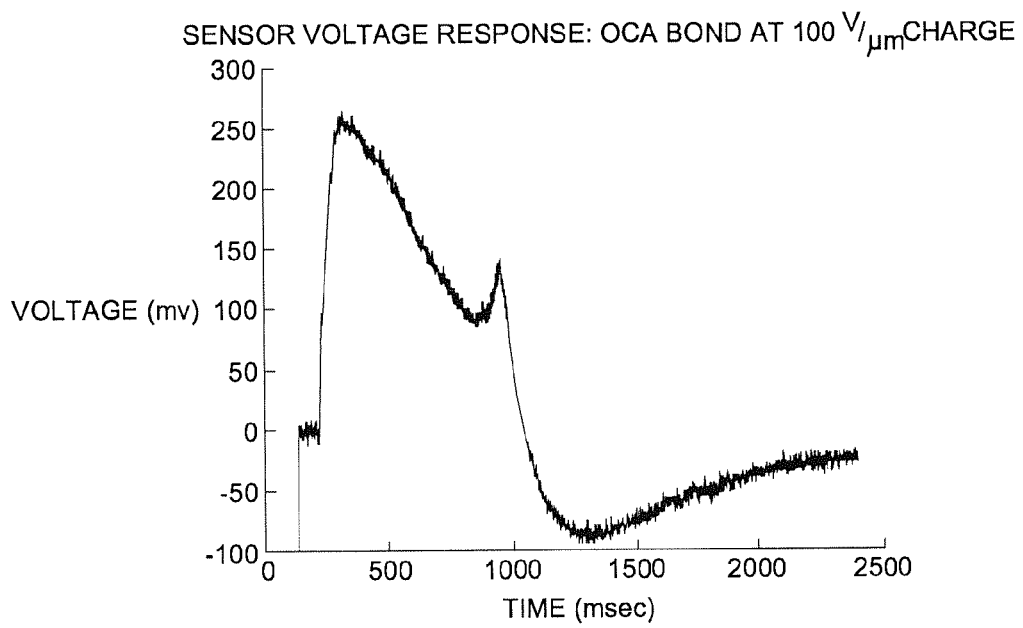
FIG. 3(a) shows the waveform of the electrical response for pre-charged EMP sensor 101 when a compressive force is applied for 500 milliseconds and then released.
Figure 3B:
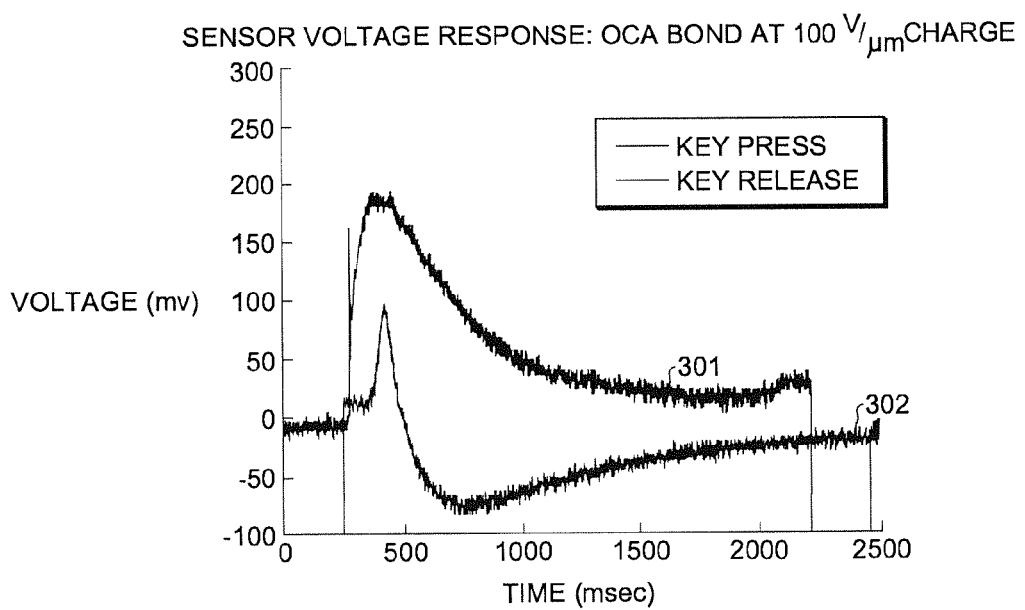
FIG. 3(b) shows waveforms 301 and 302, corresponding to the electrical responses of pre-charged EMP sensor 101, when a compressive force is sustained for 2 seconds and the electrical response of pre-charged sensor 101, for 2 seconds after a compressive force is released.

FIG. 3(a) shows the waveform of the electrical response for pre-charged EMP sensor 101 when a compressive force is applied for 500 milliseconds on EMP sensor 101 and then released. This is a waveform that would be obtained if EMP sensor 101 is used as a key on a keyboard or is provided in conjunction with a key on a keyboard, for example. FIG. 3(b) shows waveforms 301 and 302, corresponding to the electrical responses of pre-charged EMP sensor 101, when a compressive force is sustained for 2 seconds and the electrical response of pre-charged sensor 101, for 2 seconds after a compressive force is released.

As can be seen from the waveforms of FIGS. 3(a) and 3(b), when a sustained compressive force is applied to EMP sensor 101, the voltage output rises rapidly for 200 milliseconds to a peak value and then decays rapidly from the peak, even though the compressive force is maintained. However, when a sustained compressive force is removed, the electrical response from pre-charged EMP sensor 101 rises rapidly for 200 milliseconds (but only to about half the magnitude of the peak reached in waveform 301) and then decays rapidly for 300 milliseconds, before recovering over a period of 2 seconds.

Because of this relatively complex behavior of EMP sensor 101 illustrated by FIGS. 3(a) and 3(b), if EMP sensor 101 is used as a key or in conjunction with a key on a keyboard, it is difficult to deduce from the electrical signal measured across electrodes of EMP sensor 101 whether or not the key has been released. The present invention provides a method which ascertains that a key on a keyboard is pressed and remains pressed (i.e., the key has not been released). FIG. 4(a) shows a conventional method of connecting an EMP sensor. As shown in FIG. 4(a), EMP sensor 101 includes two terminals 401a and 401b, which may be modeled by capacitor electrodes 151a and 151b of FIG. 2. Conventionally, one of the terminals, shown in FIG. 4(a) as terminal 401b, is connected to the ground potential, and the other terminal (in this case, terminal 401a) provides a sensor output signal referenced to the ground potential.

According to one embodiment of the present invention, EMP sensor 101 is disconnected (e.g., by a switch) from the ground potential and left "floating", as shown in FIG. 4(b). This configuration is suitable for an application in which EMP sensor 101 is being deployed as a key on a keyboard or keypad. In this configuration, as shown in FIG. 5, noise amplitudes 501 and 502 are measured from terminal 401a (i.e., the sensor output signal of precharged EMP sensor 101) with the DC portion eliminated. (That is, the amplitude of the high frequency portion of the sensed signal at the key is taken as the noise amplitude.) Noise amplitudes 501 and 502 correspond respectively to the condition when the key implemented by EMP sensor 101 is contacted and the condition when the key is not contacted. The smaller noise amplitude results from the finger that is in contact with the key serving as a kind of ground reference for the system. Therefore, as shown in FIG. 5, noise amplitude 501 (i.e., key is not contacted) is significantly larger than noise amplitude 502 (i.e., key is contacted). Thus, under the measurement configuration of FIG. 4(b), the conditions of "key pressed" and "key released" are readily distinguishable.

The same EMP sensor may also serve as an EMP actuator, when a voltage is applied to the EMP layers through the sensing electrodes. FIG. 6 shows EMP sensor and actuator system 600 in which EMP sensor 601 is selectively connected to sensing circuit 601 and actuation circuit 602 through switching circuit 603, in accordance with one embodiment of the present invention. System 600 may be used, for example, in a keyboard application in which EMP sensor 601 senses the pressing of a key and provides, as an EMP actuator, haptic feedback to the user when a key in the keyboard is pressed.

Figure 7A:
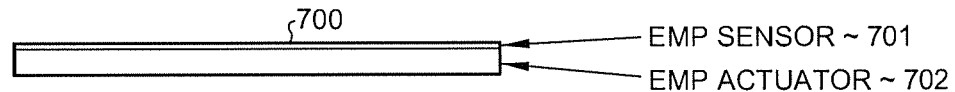
FIG. 7(a) shows EMP device 700 including EMP sensor 701 being formed on top of EMP actuator 702, in accordance with one embodiment of the present invention.
Figure 7B:
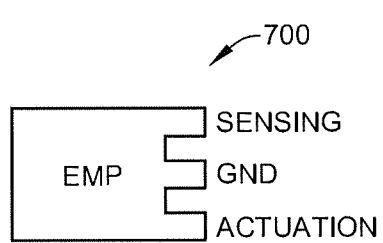
FIG. 7(b) represents EMP device 700 schematically in a configuration in which the component EMP sensor and EMP actuator in EMP device 700 share a common electrode, in accordance with one embodiment of the present invention.
Figure 7C:
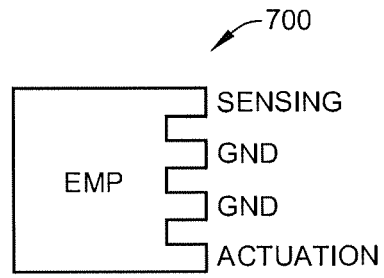
FIG. 7(c) represents EMP device 700 schematically in a configuration in which the component EMP sensor and EMP actuator in EMP device 700 are provided separate ground electrodes, in accordance with one embodiment of the present invention.

According to one embodiment of the present invention, rather than using the same EMP sensor as both actuator and sensor, as in system 600 above, an EMP sensor and an EMP actuator can be provided in close proximity, such as having an EMP sensor formed adjacent an EMP actuator (e.g., on top of or underneath). In one implementation, for example, in an EMP device including a number of EMP layers, one or more EMP layers may be assigned to form an EMP sensor, with the remaining EMP layers being assigned to form an EMP actuator. FIG. 7(a) shows EMP device 700 including EMP sensor 701 being formed on top of EMP actuator 702, in accordance with one embodiment of the present invention. In that configuration, EMP sensor 701 and EMP actuator 702 may each be provided separately accessible electrodes. EMP sensor 701 and EMP actuator 702 may share a common electrode (e.g., a common ground electrode). FIG. 7(b) represents EMP device 700 schematically in a configuration in which the component EMP sensor and EMP actuator in EMP device 700 share a common electrode (e.g., a common plate) to allow external connection, in accordance with one embodiment of the present invention. An EMP device with separate EMP sensors and EMP actuators provide better signal noise-immunity than an EMP device with multiplexed EMP layers. Alternatively, as shown in FIG. 7(c), EMP device 700 is schematically represented in a configuration in which the component EMP sensor and EMP actuator in EMP device 700 are provided separate ground electrodes, in accordance with one embodiment of the present invention.

An EMP layer in an EMP sensor or an EMP actuator of the present invention, in film form, may be selected from any of: P(VDF$_x$-TrFE$_y$-CFE$_{1-x-y}$), P(VDF$_x$-TrFE$_y$-CTFE$_{1-x-y}$), poly(vinylidene fluoride-trifluoroethylenevinylidede chloride) (P(VDF-TrFE-VC)), poly(vinylidene fluoride-tetrafluoroethylenechlorotrifluoroethylene) (P(VDF-TFE- CTFE)), poly(vinylidene fluoride-trifluoroethylenehexafluoropropylene), poly(vinylidene fluoride-tetrafluoroethylene-hexafluoropropylene), poly(vinylidene fluoride-trifluoroethylene-tetrafluoroethylene), poly(vinylidene fluoridetetrafluoroethylene-tetrafluoroethylene), poly(vinylidene fluoride-tri fluoroethylene-vinyl fluoride), poly(vinylidene fluoride-tetrafluoroethylene-vinyl fluoride), poly(vinylidene fluoridetrifluoroethylene-perfluoro(methyl vinyl ether)), poly(vinylidene fluoride-tetrafluoroethylene-perfluoro (methyl vinyl ether)), poly(vinylidene fluoride-trifluoro ethylene-bromotrifluoroethylene, polyvinylidene), poly(vinylidene fluoride-tetrafluoroethylenechlorofluoroethylene), poly(vinylidene fluoride-trifluoroethylene-vinylidene chloride), and poly(vinylidene fluoride-tetrafluoroethylene vinylidene chloride), or in a general form of P(VDF$_x$-2nd monomer$_y$-3rd monomer$_{1-x-y}$), where x may range from 0.5 to 0.75, and y may range from 0.45 to 0.2. Suitable polymers are also described in U.S. Pat. No. 6,787,238.

A suitable EMP layer can also be selected from irradiated P(VDF$_x$-TrFE$_{1-x}$) copolymers, where x varies from 0.5 to 0.75 (See, e.g., U.S. Pat. Nos. 6,423,412 and 6,605,246 for representative copolymers and compositions). A suitable EMP can be selected from the copolymer of P(VDF$_{1-x}$-CTFE$_x$) or P(VDF$_{1-x}$-HFP$_x$) where x ranges from 0.03 to 0.15 in moles. A suitable EMP can be a blend of one or more terpolymers with one or more other polymers. The EMP film can be uniaxially stretched and in fabricating the EMP actuator, the uniaxial stretching direction may be along the displacement direction of the actuator. The EMP films can be in a non-stretched form or biaxially stretched.

An EMP layer for an EMP actuator of the present invention may include semi-crystalline electromechanical polymer-based actuator materials (e.g., modified P(VDF-TrFE)), which provide remarkably improved performance for high definition haptics in handheld consumer devices. The EMP actuators of the present invention are shock-tolerant, require modest voltages consistent with requirements in OEM products, and are capable of high definition responses. Such an electro-active material can exhibit significant electrostriction (e.g., an electric field-induced strain 7%, a 70 times increase over the conventional piezo-ceramics and piezo-polymers). Furthermore, this class of polymers also possesses a high force capability, as measured by the high elastic energy density of 1 J/cm3. Suitable EMPs in this class include high energy density irradiated poly(vinylidene fluoride-trifluoroethylene) (P(VDF-TrFE), as described in U.S. Pat. Nos. 6,423,412 and 6,605,246), P(VDFTrFE)-based terpolymers, such as poly(VDF-TrFE-chlorotrifluoroethylene), (P(VDF-TrFECTFE)), poly(vinylidene fluoride-trifluoroethylene-chlorofluoroethylene), (P(VDF-TrFE-CFE)), and the like. U.S. Pat. No. 6,787,238. The disclosures in patent applications referred to in this application are incorporated herein by reference. The EMP layer may also be a relaxor ferroelectric polymer. A relaxor ferroelectric polymer may be a polymer, copolymer, or terpolymer of vinylidene fluoride. Examples include P(VDF$_x$-TrFE-CFE) or P(VDF-TrFE-CTFE) terpolymer, a high energy irradiated P(VDF$_x$-TrFE$_{1-x}$) copolymer, where x is between 0.5 and 0.75 inclusive, P(VDF$_{1-x}$-CTFE$_x$) or P(VDF$_{1-x}$-HFP$_x$) where x is in the range from 0.03 to 0.15 molar, polymer blends such as blends of P(VDF-CTFE) with P(VDF-TrFE-CFE) or P(VDF-TrFE-CTFE), where the content of P(VDF-CTFE) is between 1% and 10% by weight.

Figure 8:
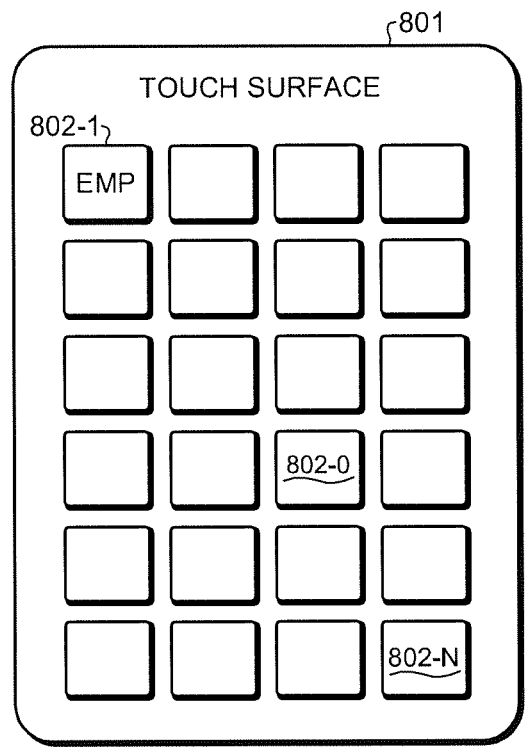
FIG. 8 shows mobile device 801 having an array of EMP devices (802-1, ..., 802-n) forming a keypad, in accordance with one embodiment of the present invention.

With transparent electrodes (e.g., those formed out of tin-doped indium oxide (ITO) or aluminum-doped zinc oxide (AZO)), transparent EMP devices including EMP sensors and EMP actuators within the scope of the present invention may be formed. Such transparent EMP devices may be formed on top of a graphical display of a mobile device, for example, to form a keyboard that provides data input and haptic feedback at the same time. FIG. 8 shows mobile device 801 having an array of EMP devices (802-1, . . . , 802-n) forming a keypad, in accordance with one embodiment of the present invention. Mobile device 801 may be, for example, a cellular telephone or a tablet computer. The surface on which the array of EMP devices are provided may be, for example, a graphical display. In one embodiment, the keypad is activated by applying predetermined, pre-charged voltages on the EMP devices. When mobile device 801 senses that a key on the keypad is touched, as sensed by the sensor portion of the corresponding key (e.g., 802-i), the actuator portion of that key is activated to provide a haptic response.

The detailed description above is provided to illustrate specific embodiments of the present invention and is not intended to limiting. Numerous modifications and variations within the scope of the present invention are possible. The present invention is set forth in the accompanying claims.

We claim:

1. An electromechanical polymer (EMP) sensor, comprising:
    a first set of EMP layers provided between a first electrode and a second electrode forming a capacitor, the first set of EMP layers having one or more EMP layers capable of being activated by application of a voltage across the first and second electrodes;
    a voltage source; and
    a sensing circuit coupled to the first electrode and the second electrode for applying a pre-determined voltage across the capacitor using the voltage source, disconnecting the voltage source from the capacitor thereafter in a manner such that one of the first and second electrodes becomes floating, and detecting a change in capacitance or a change in voltage across the first and second electrodes after disconnecting the voltage source.

2. The EMP sensor of claim 1, wherein disconnecting the voltage source comprises disconnecting the second electrode from a ground reference.

3. The EMP sensor of claim 2, wherein the sensing circuit detects a non-DC portion of a voltage across the first and second electrode.

4. The EMP sensor of claim 1, further comprising:
    an EMP actuator activation circuit; and
    a switch circuit selectively connecting the first electrode and the second electrode to either input terminals of the sensing circuit and input terminals of the EMP actuator activation circuit.

5. The EMP sensor of claim 1, further comprising:
    a second set of EMP layers provided between a third electrode and a fourth electrode, the second set of EMP layers having one or more EMP layers capable of being activated by application of a voltage across the third and the fourth electrodes; and
    an EMP actuator activation circuit coupled to the third electrode and the fourth electrode for applying an activation signals to the second set of EMP layers.

6. The EMP sensor of claim 5, wherein the second electrode and the fourth electrode are connected to common ground.

7. The EMP sensor of claim 6, wherein the second electrode and the fourth electrode are connected to separate ground voltage references.

8. The EMP sensor of claim 4, wherein the electrodes are formed out of transparent conducting material.

9. The EMP sensor of claim 8, wherein the EMP sensor is provided in the form of a key on a keyboard.

10. The EMP sensor of claim 9, wherein the key is one of an array of EMP sensors provided on a mobile device.

11. The EMP sensor of claim 10, wherein the key is provided on a graphical display of the mobile device.

12. The EMP sensor of claim 10, wherein when the sensing circuit senses that the key is in contact with a user, the EMP actuator circuit activates the second set of EMP layers to provide a vibration as a haptic response.

13. The EMP sensor of claim 1, wherein each EMP layer includes a relaxor ferroe ectric polymer.

14. The EMP sensor of claim 13, wherein the relaxor ferroelectric polymer comprises a polymer, copolymer, or terpolymer of vinylidene fluoride.

15. The EMP sensor of claim 1, wherein each EMP layer includes a polymer selected from a group of polymers consisting of: P(VDF$_x$-TrFE$_y$-CFE$_{1-x-y}$) (CFE: chlorofluoroethylene), P(VDF$_x$-TrFE$_y$-CTFE$_{1-x-y}$) (CTFE: chlorotrifluoroethylene), Poly(vinylidene fluoride-trifluoroethylene-vinylidede chloride) (P(VDF-TrFE-VC)), poly(vinylidene fluoride-tetrafluoroethylene-chlorotrifluoroethylene) (P(VDF-TFE-CTFE)), poly(vinylidene fluoride-trifluoroethylene-hexafluoropropylene), poly(vinylidene fluoride-tetrafluoroethylene-hexafluoropropylene), poly(vinylidene fluoridetrifluoroethylene-tetrafluoroethylene), poly(vinylidene fluoride-tetrafluoroethylenetetrafluoroethylene), poly(vinylidene fluoride-trifluoroethylene-vinyl fluoride), poly(vinylidene fluoride-tetrafluoroethylene-vinyl fluoride), poly(vinylidene fluoride-trifluoroethyleneperfluoro(methyl vinyl ether)), poly(vinylidene fluoride-tetrafluoroethylene-perfluoro (methyl vinyl ether)), poly(vinylidene fluoride-trifluoroethylene-bromotrifluoroethylene, polyvinylidene), poly(vinylidene fluoride-tetrafluoroethylene-chlorofluoroethylene), poly(vinylidene fluoride-trifluoroethylene-vinylidene chloride), and poly(vinylidene fluoride-tetrafluoroethylene vinylidene chloride), where x ranges between 0.5 and 0.75 and y ranges between 0.45 and 0.2.

16. The EMP sensor of claim 1, wherein each EMP layer includes a P(VDF-TrFE-CFE) or P(VDF-TrFE-CTFE) terpolymer.

17. The EMP sensor of claim 1, wherein each EMP layer includes a high energy irradiated P(VDF$_x$-TrFE$_{1-x}$) copolymer, where x is between 0.5 and 0.75 inclusive.

18. The EMP sensor of claim 1, wherein each EMP layer includes P(VDF$_{1-x}$-CTFE$_x$) or P(VDF$_{1-x}$-HFP$_x$) where x is in the range from 0.03 to 0.15 molar.

19. The EMP sensor of claim 1, wherein the EMP actuator comprises an EMP layer that includes a blend of P(VDF-CTFE) with P(VDF-TrFE-CFE) or P(VDF-TrFE-CTFE), where the content of P(VDF-CTFE) is in the range of 1% to 10% by weight.

* * * * *

UNITED STATES PATENT AND TRADEMARK OFFICE
CERTIFICATE OF CORRECTION

PATENT NO. : 9,507,468 B2  
APPLICATION NO. : 14/015875  
DATED : November 29, 2016  
INVENTOR(S) : Li Jiang et al.

Page 1 of 1

It is certified that error appears in the above-identified patent and that said Letters Patent is hereby corrected as shown below:

In the Claims

Column 7, Line 14, "ferroe ectric" should be --ferroelectric--

Signed and Sealed this
Twenty-eighth Day of February, 2017

Michelle K. Lee
*Director of the United States Patent and Trademark Office*